United States Patent

Olson

[11] Patent Number: 5,312,489
[45] Date of Patent: May 17, 1994

[54] ROTARY FIXTURE FOR VAPOR DEPOSITION COATING APPARATUS

[75] Inventor: Roger A. Olson, Amery, Wis.

[73] Assignee: Union Carbide Chemicals & Plastics Technology Corporation, Danbury, Conn.

[21] Appl. No.: 129,471

[22] Filed: Sep. 30, 1993

[51] Int. Cl.$^5$ .............................................. C23C 16/00
[52] U.S. Cl. ................................. 118/719; 118/715; 118/726; 427/255.6; 427/237; 427/238
[58] Field of Search ................ 118/715, 719, 726; 427/255.6, 237, 238

[56] References Cited

U.S. PATENT DOCUMENTS

| | | | |
|---|---|---|---|
| 3,246,627 | 4/1966 | Loeb et al. | 118/726 |
| 3,678,889 | 7/1972 | Murakami et al. | 118/720 |
| 4,401,053 | 8/1983 | Riley | 118/721 |
| 4,495,889 | 1/1985 | Riley | 118/666 |
| 4,552,092 | 11/1985 | Yanagi et al. | 118/718 |
| 4,556,471 | 12/1985 | Bergman et al. | 204/298 |
| 4,592,306 | 6/1986 | Gallego | 118/719 |
| 4,683,143 | 7/1987 | Riley | 427/8 |
| 4,699,082 | 10/1987 | Hakim | 118/716 |
| 4,945,856 | 8/1990 | Stewart | 118/715 |
| 5,201,956 | 4/1993 | Humphrey et al. | 118/716 |

Primary Examiner—Richard Bueker
Attorney, Agent, or Firm—W. K. Volles

[57] ABSTRACT

Apparatus are disclosed for coating the inside surfaces of hollow objects with a coating material by vapor deposition wherein the objects are removably attached to a rotary fixture which is employed for holding the objects while the coating process is being conducted. The rotary fixture comprises a hollow chamber rotatably mounted about an axis of rotation wherein the chamber can have a plurality of connecting union assemblies which secure the objects and provide communication between the inside surfaces of the objects and the inside space of the hollow chamber. The coating material is introduced from the interior space of the hollow chamber to the interior space of the objects under vacuum conditions.

14 Claims, 2 Drawing Sheets

ROTARY FIXTURE FOR VAPOR DEPOSITION COATING APPARATUS

FIELD OF THE INVENTION

The present invention generally relates to apparatus for coating articles with a coating material, e.g., parylene, by vapor deposition. More specifically, the present invention relates to a rotary fixture for coating the inside surfaces of hollow objects with a coating material by vapor deposition.

BACKGROUND OF THE INVENTION

Coating materials, e.g., polymers, are often used as protective barriers on circuit boards, electrical components, medical devices and the like. Parylene is a generic term often used to describe a class of poly-p-xylylenes which are derived from a dimer of the structure:

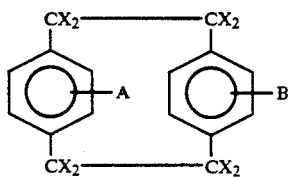

where X is typically hydrogen or a halogen, e.g., fluorine, and A and B, when present, are halogens, e.g., chlorine. Due to its ability to provide thin films and conform to substrates of varied geometric shapes, parylene is ideally suited for use as a conformal coating.

Typically, parylene is applied by vapor deposition under vacuum conditions wherein the parylene monomer is condensed and polymerized directly on the surface of the object to be coated. Since the parylene monomer is not stable, the parylene dimer, as illustrated above, is used as the starting material.

Typical apparatus for carrying out parylene vapor deposition coating processes comprise a vaporization zone, wherein the parylene dimer is vaporized, a pyrolysis zone, wherein the parylene dimer is pyrolyzed to its monomeric form, a deposition chamber, wherein the objects to be coated are exposed to the parylene monomer, and a vacuum means for maintaining vacuum conditions within the deposition chamber.

Apparatus such as described above have been particularly useful for coating the external surfaces of objects. However, apparatus are also desired for coating the inside surfaces of hollow objects with a coating material, e.g., parylene, by vapor deposition.

SUMMARY OF THE INVENTION

In accordance with the present invention, apparatus are provided for coating the inside surfaces of hollow objects with a coating material, e.g., parylene, by vapor deposition. The apparatus utilize a rotary fixture for holding the objects during the coating process. The fixture comprises a hollow chamber which is rotatably mounted about an axis of rotation and connecting union assemblies positioned at desired locations on the outside surface of the chamber which provide communication between the inside of the chamber and the internal surfaces of the objects to be coated.

By virtue of the present invention, it is now possible to selectively coat the inside surfaces of hollow objects with a coating material by vapor deposition. In accordance with the present invention, multiple objects can be coated in an efficient manner. The rotational speed of the rotary fixture can be correlated to match the desired coating exposure time in order to achieve the desired thickness of coating material on the inside surfaces of the objects.

DETAILED DESCRIPTION OF THE INVENTION

The particular objects being coated are not critical to the present invention. The objects can have a variety physical geometries and sizes. Often the objects are relatively small in size, e.g., with an internal volume of less than about 50 cubic inches. Examples of typical objects suitable for coating with the apparatus of the present invention include; modules containing electronic components, e.g., voltage regulators, and ignition modules; medical devices; glass vials and other containers, and the like.

The invention is hereafter described with reference to the drawings which are presented for illustrative purposes and are not intended to limit the scope of the claims which follow.

Figure 1:
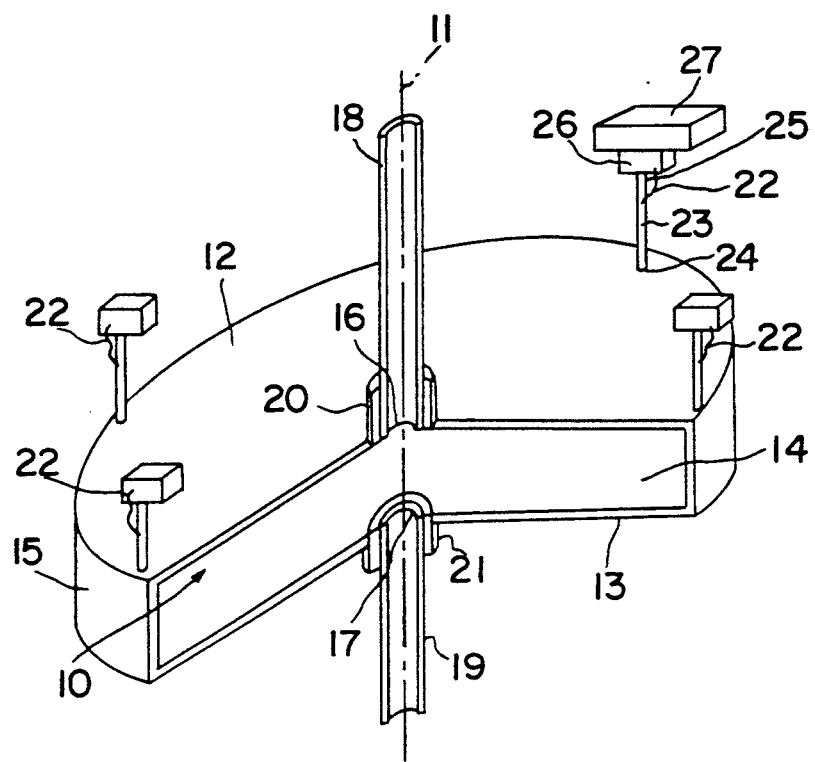
FIG. 1 is a perspective view of a rotary fixture in accordance with the present invention.

FIG. 1 illustrates a sectional perspective view of a rotary fixture for coating the inside surfaces of hollow objects with a coating material be vapor deposition.

The rotary fixture comprises a hollow chamber 10 which is rotatably mounted about an axis of rotation 11. Chamber 10 has a top wall 12, a bottom wall 13, and an interior space 14. The internal volume of the chamber is not critical to the present invention. However, it is preferred that the chamber be large enough so that the pressure therein is not significantly affected, i.e., less than a 20% change in absolute pressure, when the objects to be coated are removed from and attached to the chamber. Similarly, the particular geometry of the chamber is not critical to the present invention, e.g., circular, oval, octagonal, etc. One preferred geometry from a top view perspective is a circular cross-sectional geometry. Typically the chamber will comprise a side wall 15 connecting bottom wall 13 to the top wall 12. Preferably, the chamber comprises a base comprising bottom wall 13 and optionally side wall 15, and a cover comprising top wall 12 which is removably attached to the base. The removable cover provides for periodic cleaning and removal of coating material from the inside surfaces of the chamber.

The chamber further comprises a first vapor transfer port 16 which is concentrically disposed about axis of rotation 11 through top wall 12 and in communication with interior space 14. Similarly, a second vapor transfer port 17 is provided through bottom wall 13.

FIG. 1 also illustrates a first connecting conduit 18 in communication with first vapor transfer port 16 which is connected by a rotary seal 20. Similarly, a second connecting conduit 19 is in communication with second vapor transfer port 17 which is connected by rotary seal 21. Details concerning rotary seals 20 and 21 are known to those skilled in the art.

The rotary fixture further comprises at least one, and preferably from about 2 to 360, connecting union assemblies 22 which comprise a hollow member 23 having a first end 24 attached to top wall 12 and in communication with interior space 14 and a second end 25 which is in communication with a valve means 26.

Preferably, valve means 26 comprises a mechanical valve which is positionable between an open position and a closed position, wherein the valve is actuated to the open position by attaching an object 27 to connecting union assembly 22 and activated to the closed position by removing object 27 from connecting union 22. Details concerning such valve means are known to those skilled in the art. One typical valve means comprises a simple hinged lid positioned at the second end of hollow member 23 which opens when object 27 is placed onto connecting union assembly 22 and closes when object 27 is removed from connecting union assembly 22. Those skilled in the art will recognize that other mechanical valve means as well as other valve means, e.g., electrically actuated valve means, can also be used in accordance with the present invention.

Preferably, the desired number of connecting union assemblies, are disposed radially about axis of rotation 11 on a surface of chamber 10. Thus, a typical orientation would comprise a plurality of connecting union assemblies disposed about the perimeter of top wall 12. It may also be desirable to arrange the connecting union assemblies in concentric circles about axis of rotation 11 on a surface of chamber 10.

The rotary fixture may also comprise baffles or other flow distribution means within internal space 14 in order to direct the flow of coating material. Details concerning baffling and flow distribution are known to those skilled in the art.

Figure 2:
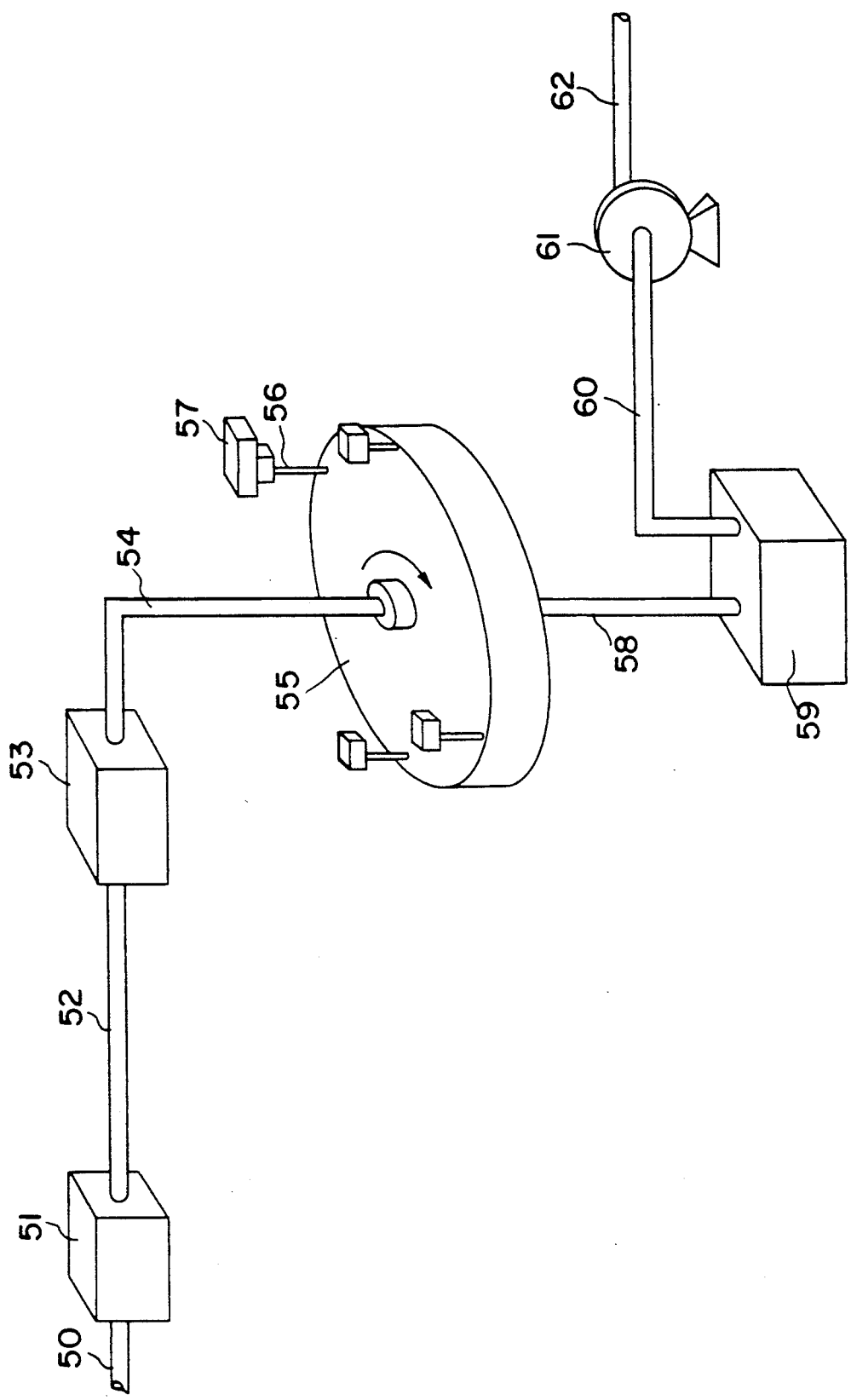
FIG. 2 is a perspective view of a vapor deposition apparatus which includes a rotary fixture in accordance with the present invention.

FIG. 2 illustrates a perspective view of a vapor deposition apparatus suitable for coating the internal surfaces of hollow objects with a coating material by vapor deposition under vacuum conditions.

FIG. 2 is hereafter described with reference to parylene as the coating material, although those skilled in the art will recognize that other polymers may exist, now or in the future, which are suitable for use as coating materials in the apparatus of the present invention. Parylene dimer, the starting material, is commercially available from a variety of sources, e.g., Union Carbide Corporation, Danbury, Conn.

Parylene dimer is introduced to the apparatus by a line 50 which is connected to a vaporization zone 51 wherein the parylene dimer is vaporized. The vaporization zone comprises a heater which is capable of vaporizing the parylene at typical pressures used in the coating process, e.g., from about 1 to 50 millitor. The temperature in the vaporization zone typically ranges from about 80° to about 200° C.

Vaporized parylene dimer is passed from the vaporization zone by a line 52 to a pyrolysis zone 53 wherein the parylene dimer is pyrolyzed to form the parylene monomer. The pyrolysis zone comprises a heater which is capable of pyrolyzing the parylene dimer at typical pressures used in the parylene process. The temperature in the pyrolysis zone typically ranges from about 500° to 750° C., preferably from about 650° to 750° C. and more preferably from about 680° to 700° C.

Parylene monomer is passed from the pyrolysis zone by a line 54 to a rotary fixture 55, such as described with reference to FIG. 1. Rotary fixture 55 comprises 120 connecting union assemblies disposed radically around the perimeter of rotary fixture 55 (4 shown). Each connecting union assembly has an object 57 attached thereto (1 shown). The inside area of rotary fixture 55 is communication with the interior space all of the objects 57.

Rotary fixture 55 is rotated in the direction indicated by the arrow by a drive means (not shown) either continuously rotated or discreetly indexed, e.g., 3 degree movement per increment. The average speed of rotation, e.g., 2 revolutions per hour, is preferably correlated to the residence time required to coat the inside surfaces of the objects with the desired thickness of parylene so that the desired thickness is achieved in one revolution. Such operation, can provide for efficient coating of multiple objects. For example, an operator could conveniently remove one coated object from a connecting union assembly each time the rotary fixture indexes and replace it with an uncoated object. In an operation where 120 objects are loaded onto the rotary fixture and the rotary fixture rotates at 2 revolutions per hour with a 3 degree movement per index, the operator would be required to remove a coated object and replace it with an uncoated object every 15 seconds.

Since the process is conducted under vacuum conditions, a means for creating a vacuum within the rotary fixture is provided.

A suction line 58, in communication with rotary fixture 55, is connected to a cryogenic condensation trap 59 wherein residual vapors of parylene monomer are condensed, polymerized and isolated. One suitable cryogenic fluid for use in the condensation trap is liquid nitrogen.

Residual vapor from condensation trap 59 is withdrawn by a line 60 and passed through a vacuum pump 61. The vacuum pump operates in order to provide subatmospheric pressure in the rotary fixture and preferably provide a pressure of from about 10 to 50 milliters. The discharge from the vacuum pump is withdrawn from the apparatus by a line 62.

Although the invention has been described herein with respect to specific aspects, modifications, and alterations of the apparatus described herein are intended to be included within the scope of the claims which follow.

I claim:

1. A rotary fixture for coating the inside surfaces of hollow objects with a coating material by vapor deposition, comprising:
    (i) a hollow chamber rotatably mounted about an axis of rotation, said chamber having a top wall, a bottom wall and an interior space;
    (ii) a first vapor transfer port concentrically disposed about the axis of rotation through the top wall and in communication with the interior space of the chamber;
    (iii) a second vapor transfer port concentrically disposed about the axis of rotation through the bottom wall and in communication with the interior space of the chamber; and
    (iv) at least one connecting union assembly comprising;
        (a) a hollow connecting member having a first end attached to the top wall of the chamber and in communication with the interior space of the chamber, and a second end; and
        (b) a valve means in communication with the second end.

2. The apparatus of claim 1 comprising from about 2 to 300 connecting union assemblies.

3. The apparatus of claim 1 wherein the valve means comprises a mechanical valve positionable between an open position and a closed position, wherein the valve is actuated to the open position by attaching the object to the connecting union assembly and activated to the closed position by removing the object from the connecting union.

4. The apparatus of claim 1 wherein the chamber has at least one side wall disposed between the top wall and the bottom wall.

5. The apparatus of claim 4 wherein the chamber has a circular cross-sectional geometry.

6. The apparatus of claim 5 wherein the connecting union assemblies are disposed radially about the axis of rotation.

7. The apparatus of claim 6 wherein concentric circles of connecting union assemblies are disposed radially about the axis of rotation.

8. The apparatus of claim 1 wherein the chamber comprises a base comprising the bottom wall and a cover comprising the top wall, wherein the cover is removably attached to the base.

9. An apparatus for coating the inside surfaces of hollow objects with parylene by vapor deposition under vacuum conditions comprising:
   (A) a rotary fixture comprising:
      (i) a hollow chamber rotatably mounted about an axis of rotation, said chamber having a top wall, a bottom wall and an interior space;
      (ii) a first vapor transfer port concentrically disposed about the axis of rotation through the top wall and in communication with the interior space of the chamber;
      (iii) a second vapor transfer port concentrically disposed about the axis of rotation through the bottom wall and in communication with the interior space of the chamber; and
      (iv) at least one connecting union assembly comprising;
         (a) a hollow member having a first end attached to the top wall of the chamber and in communication with the interior space of the chamber, and a second end; and
         (b) a valve means in communication with the second end;
   (B) a vaporization zone to which parylene dimer can be introduced;
   (C) a pyrolysis zone connected having an entrance end in communication with the vaporization zone and an exit end in communication with the first vapor transfer port of the rotary fixture; and
   (D) a vacuum means having a suction end and a discharge end, said suction end being in communication with the second vapor transfer port of the rotary fixture.

10. The apparatus of claim 9 wherein the valve means comprises a mechanical valve positionable between an open position and a closed position, wherein the valve is actuated to the open position by attaching the object to the connecting union assembly and actuated to the closed position by removing the object from the connecting union assembly.

11. The apparatus of claim 9 which further comprises a first connecting conduit having a first end in communication with the pyrolysis zone and a second end in communication with the first vapor transfer port of the rotary fixture.

12. The apparatus of claim 11 which further comprises a second connecting conduit having a first end in communication with the suction end of the vacuum means and a second end in communication with the second vapor transfer port of the rotary fixture.

13. The apparatus of claim 12 further comprising a first rotary seal concentrically disposed about the axis of rotation and positioned between the second end of the first connecting conduit and the first vapor transfer port of the rotary fixture.

14. The apparatus of claim 12 further comprising a second rotary seal concentrically disposed about the axis of rotation and positioned between the first end of the second connecting conduit and the second vapor transfer port of the rotary fixture.

* * * * *